United States Patent [19]

Hartwick

[11] Patent Number: 4,881,024

[45] Date of Patent: Nov. 14, 1989

[54] VOLTAGE SENSITIVE SWITCH

[75] Inventor: L. Paul Hartwick, London, Canada

[73] Assignee: Trek-Tron Coolers Inc., Brantford, Canada

[21] Appl. No.: 281,645

[22] Filed: Dec. 9, 1988

[30] Foreign Application Priority Data

Sep. 5, 1988 [CA] Canada .................................. 566335

[51] Int. Cl.⁴ .................................................. G05F 5/00

[52] U.S. Cl. ...................................... 323/299; 307/358

[58] Field of Search ........................ 307/358, 359, 363; 323/283, 299

[56] References Cited

U.S. PATENT DOCUMENTS 4,025,843 5/1977 Parker ................................. 323/283
4,200,833 4/1980 Wilkerson ........................... 323/283
4,233,557 11/1980 Alberkrack ......................... 323/283
4,277,697 8/1981 Hall et al. ........................... 307/358

*Primary Examiner*—Patrick R. Salce
*Assistant Examiner*—Jeffrey Sterrett

[57] ABSTRACT

The voltage comparison circuit uses digital gates formed into at least two pairs of flip flops, one digital gate having a volt reference supply to and acting to disconnect a load from a source when the voltage of the source declines below a predetermined threshold. In another aspect the circuit provides further digital gates which operate upon transistor and cycle a load for connection to a source on a duty cycle of 100 to 150 seconds on and off so that the load is provided with an intermitten secondary energy source which provides limited drain on the permanent source, which if it be a battery or a storage battery insures that the battery is not drained on a continuous basis even though the load may so demand. The circuit also monitors the voltage threshold of the primary source so that should it fall below that threshold the load is disconnected.

6 Claims, 1 Drawing Sheet

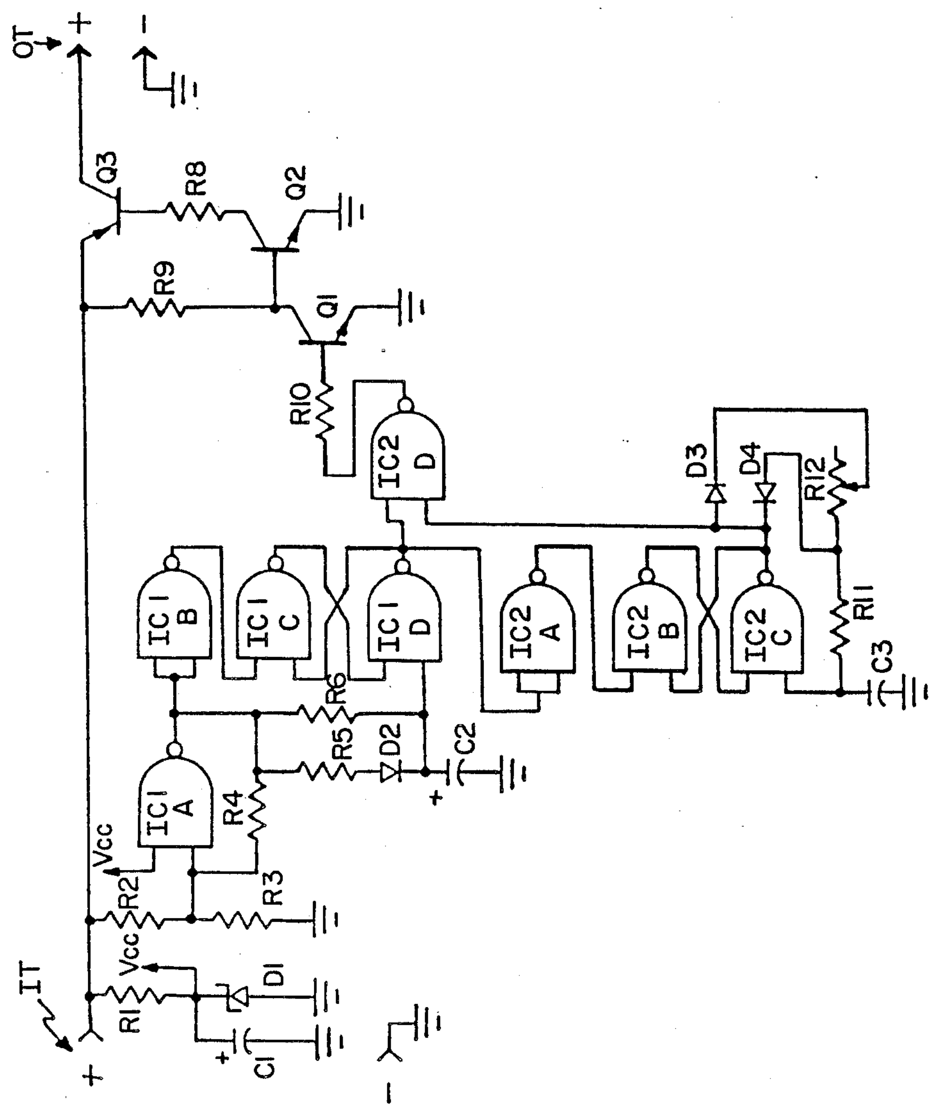
OT
IT
Q3
R8
Q2
R9
QI
RIO
IC2 D
IC1 A
IC1 B
IC1 C
IC1 D
IC2 A
IC2 B
IC2 C
D1
D2
D3
D4
R1
R2
R3
R4
R5
R6
R11
R12
C1
C2
C3
Vcc

VOLTAGE SENSITIVE SWITCH

This invention relates to a voltage switch.

In applications where a secondary source of energy, such as a battery, is used to power thermoelectric loads, or to supply energy to a load, it is useful to provide some voltage sensitive switch to regulate the flow of current to the load so that the secondary energy source voltage does not fall below a predetermined threshold which might otherwise injure other electrical components or systems connected to that secondary source when high current demands are used.

In automobile applications, the secondary source is generally a lead-acid battery and during engine start-up of the internal combustion engines the battery source is required to provide large currents almost always exceeding 200 amperes.

In order to ensure this current source is available the voltage of the lead-acid battery should not fall below approximately 10.5 volts preferably not below 11.5 volts.

When auxillary electrical systems are required to be run while the engine is off, and hence the battery is not being charged by the alternator, some voltage sensitive switch is desirable to control the current flow to the auxillary loads so as to ensure, at all times, that the lead-acid battery is maintained at a chargee level sufficient to allow the engine to be turned over at will.

It is particularly important, where cooling systems such as refrigerators and freezers are used in mobile homes and have electric motors driving loads.

It is thus an object to ensure that these devices do not discharge the battery to a degree which would inhibit the battery providing the needed energy to start the mobile home internal combustion engine.

I have conceived of a voltage sensitive switch adapted to be interconnected between battery and auxillary energy load regulating the current flowing to that energy load in response to the voltage supplied by the lead-acid battery and to cut off the current flow thereto when the voltage of the battery drops below a predetermined threshold.

Preferably the predetermined threshold is about 11.5 volt.

I also have achieved a voltage sensitive switch which includes a switchingg timer allowing current to flow periodically to the secondary or auxillary load while at the same time monitoring the threshold voltage of the supplying battery and if that voltage falls below threshold to terminate the flow of current to the auxillary load.

In one aspect the object of the invention is to provide a voltage comparison circuit that uses digital gates formed into at least two pairs of flip flops, one digital gate having a volt reference supply to and acting to disconnect a load from a source when the voltage of the source declines below a predetermined threshold. In another aspect the circuit provides further digital gates which operate upon transistors and cycle a load for connection to a source on a duty cycle of 100 to 150 seconds on and off so that the load is provided with an intermitten secondary energy source which provides limited drain on the permanent source, which if it be a battery or a storage battery insures that the battery is not drained on a continuous basis even though the load may so demand. The circuit also monitors the voltage threshold of the primary source so that should it fall below that threshold the load is disconnected.

The invention therefore, contemplates a voltage comparison circuit for comparing an analog voltage of a source, the circuit comprising:

(a) a first digital gate in series with a second digital gate acting as an inverter, and a pair of digital gates arranged as flip flops each digital gate with a pair of inputs;

(b) a feedback resistor interconnecting the output of the first digital gate to one of the inputs of said first digital gate;

(c) a voltage divider connected between the voltage source and said feedback resistor (b); and, (d) means for providing a predetermined reference voltage to the other input of said digital gate.

In that respect the comparison circuit includes a zener diode in series with a limiting resistor connected to the source so as to cycle the source on and off at between 100 to 150 seconds for each cycle and to provide thereby cycling of the load.

In another aspect this cycling is achieved with a second pair of digital gates arranged as a flip flop, the output of which passes through a further digital gate connected to the base of a first transistor whose collector is connected to the base of a second transistor whose collector is in series with a resistor connected to the base of a third transistor the emitter of which is connected to the current input circuit with collector connected to the output terminal of the comparator circuit.

The embodiments of the invention will now be described by way of example and reference to the accompanying single drawing being a circuit diagram of the voltge sensitive switch according to the invention.

Referring to the FIGURE, the circuit includes a pair of input terminals IT and a pair of output terminals OT with each negative terminal grounded. From the positive input terminal IT+ is a limiting resistor placed in serious with a zenor diode D1 that is in parallel with a capacitor C1 to ground. The resistor R1 acts as a current limiting resistor for the Zener Diode D1, which provides a constant operating voltage to integrated circuits (in digital gates) IC1 and IC2 as will be explained. The positive input terminal IT is also connected to a voltage divider being series resistors R2 and R3 whose opposite end is grouned while at the same time the divider is directly connected to the emitter stage of an output transistor Q3, and as well through a load resistor R9, to the collector of transistor Q1 and to the base of transistor Q2 in a manner that will be described hereafter.

The voltage divider R2 and R3 provides an input to the first gate of intergrated circuit IC1A while the other input to this gate is that constant voltage Vcc generated by the zener diode D1. With this arrangement, when the input from R2 and R3 is high the output of IC1A will be low. When the input from R2 and R3 is low the output of IC1A will be high. The threshold voltage of IC1A is determined by the input level of Vcc. A switching hysteresis of 0.38 volts is established. The addition of resistor R4 between gates IC1A and IC1B creates a negative feedback input to gate IC1A to reduce the switching hysteresis voltage of 0.38 volts and allows a more precise output of IC1A. The gate IC1B is an invertor to achieve the proper digital input and to "clear" the flip flop arrangement of IC1C and IC1D, as will become apparent.

The input to gate IC1D is determined by a charge/-discharge ratio comprised of the output of gate IC1A, the charging of capacitor C2 through resistor R5 and diode D2, and the discharge of capacitor C2 through resistor R6. A small value for the resistor R5 allows a fast charging of the capacitor C2 and while a large value of resistor R6 allows a slow discharge of the capacitor C2. Typical values satisfactory for this charge/discharge ratio are resistor values, for R5 100K ohms, and for R6 10M ohms.

On initial power up of the capacitor C2 as an input to gate IC1D the same appears as a dead short, a low input, and therefore the output of gate IC1D is high. The output of gate IC1D goes low when the capacitor C2 is charged and will stay low after the output of gate IC1A goes low until that time that capacitor C2 has slowly discharged through resistor R6. If the output of gate IC1D is configured to the output transistor drive stage Q3, as shown, this circuit provides the protection to a secondary energy load at output terminals OT.

To provide an adjustable duty cycle for the output OT, the gate IC2D determines the drive control condition on its inputs from the flip flop arrangement of the gates IC1C and IC1D, and as well from the flip flop arrangement of gates IC2B and IC2C. This second flip flop arrangement, behaves as an oscillator with an adjustible charge path through diode D3, variable resistors R12 and R11, and a discharge path through resistor R11 and diode D4.

When the output of gate IC2D is low (has two high inputs) the transistor Q1 is turned off and the resistor R9 will pull up the base of transistor Q2 causing it to turn on. When transistor Q2 is on, the transistor Q3 is also on allowing current to pass through the circuit and hence to provide power at the output OT. The output of gate IC2D is high either when the flip flop oscillator (IC2-B+IC1D) resets because of a low supply voltage detected at gate IC1A, or when a high output appears at gate IC2C as part of the duty cycle established by the charge/discharge rate of the voltage devider R11 and R12 and the diodes D3 and D4 in cooperation with capacitor C2. This causes the transistor Q1 to be turned on and the transistor Q3 to be turned off. When the transistor Q3 is turned off, as part of the duty cycle, the battery source at the terminal IT is not drawn upon as the load has been disconnected.

The embodiments of the invention in which an exclusive property or privilege is claimed are defined as follows:

1. A voltage comparison circuit for comparing an analogue voltage of a source, said circuit comprising:

(a) a first digital gate in series with a second digital gate acting as an inverter, and a pair of digital gates arranged as flip flops each digital gate with a pair of inputs;

(b) a feedback resistor interconnecting the output of the first digital gate to one of the inputs of said first digital gate;

(b) a feedback resistor interconnecting the output of said first digital gate to one of the inputs of said first digital gate;

(c) a voltage divider connected between the voltage source and said feedback resistor; and, (d) means for providing a predetermined reference voltage to the other input of said digital gate.

2. The voltage comparison circuit as claimed in claim 1 wherein the reference voltage means includes a zener diode in series with a current limiting resistor connected to said voltage source.

3. The circuit as claimed in claim 2 wherein said means for regulating the threshold voltage includes a voltage divider with a resistor in series with a discharge capacitor connected to ground and to one gate of said second flip flops and a pair of diodes in opposite polarity and in parallel to said voltage divider.

4. The circuit as claimed in claim 2 including a second pair of digital gates arranged as flip flops, the output of which passes through a digital gate to the base of a first transistor whose collector is connected to the base of a second transistor whose collector is in series with a resistor connected to the base of a third transistor the emitter of which is connected to the voltage source with the collector connected to an output terminal of the circuit, the second pair of flip flops connected through an inverter to the output of the first flip flops, the second flip flops having means for regulating the threshold voltage thereof.

5. The circuit as claimed in claim 1 including a second pair of digital gates arranged as flip flops, the output of which passes through a digital gate to the base of a first transistor whose collector is connected to the base of a second transistor whose collector is in series with a resistor connected to the base of a third transistor the emitter of which is connected to the voltage source with the collector connected to an output terminal of the circuit, the second pair of flip flops connected through an inverter to the output of the first flip flops, the second flip flops having means for regulating the threshold voltage thereof.

6. The circuit as claimed in claim 5 wherein said means for regulating the threshold voltage includes a voltage divider with a resistor in series with a discharge capacitor connected to ground and to one gate of said second flip flops and a pair of diodes in opposite polarity and in parallel to said voltage divider.

* * * * *